United States Patent
Fortuin et al.

(10) Patent No.: US 8,189,117 B2
(45) Date of Patent: May 29, 2012

(54) RECEIVER FOR AMPLITUDE-MODULATED SIGNALS

(75) Inventors: Rob Fortuin, Eindhoven (NL); Hubertus J. F. Maas, Eindhoven (NL)

(73) Assignee: NXP B.V. (NL)

( * ) Notice: Subject to any disclaimer, the term of this patent is extended or adjusted under 35 U.S.C. 154(b) by 1030 days.

(21) Appl. No.: 11/996,299

(22) PCT Filed: Jul. 26, 2006

(86) PCT No.: PCT/IB2006/052556
§ 371 (c)(1),
(2), (4) Date: Jun. 3, 2008

(87) PCT Pub. No.: WO2007/013033
PCT Pub. Date: Feb. 1, 2007

(65) Prior Publication Data
US 2008/0247490 A1    Oct. 9, 2008

(30) Foreign Application Priority Data
Jul. 29, 2005  (EP) ................................ 05107050

(51) Int. Cl.
*H04N 5/455* (2006.01)
(52) U.S. Cl. ........ 348/726; 348/638; 348/639; 348/549; 348/539; 375/320; 375/371; 375/240

(58) Field of Classification Search .................. 348/726, 348/638, 639, 539, 549; 375/320, 371, 240, 375/351, 346, 324
See application file for complete search history.

(56) References Cited

U.S. PATENT DOCUMENTS

| 4,631,499 | A | | 12/1986 | Kasperkovitz |
| 5,692,013 | A | * | 11/1997 | Koslov et al. ................. 375/277 |
| 5,867,539 | A | * | 2/1999 | Koslov ........................ 375/346 |
| 2002/0106018 | A1 | * | 8/2002 | D'Luna et al. ........... 375/240.01 |

FOREIGN PATENT DOCUMENTS
EP    0373686 A1    6/1990
* cited by examiner

*Primary Examiner* — Joseph P Hirl
*Assistant Examiner* — Jivka Rabovianski
(74) *Attorney, Agent, or Firm* — Kramer & Amado P.C.

(57) ABSTRACT

In a receiver, a synchronization circuit (MIX2, OSC, C1, R1) provides a set of oscillator signals (OSI, OSQ) that are synchronized with a carrier of an amplitude-modulated signal. The set of oscillator signals (OSI, OSQ) comprises a quadrature oscillator signal (OSQ), which is substantially 90° phase shifted with respect to the carrier of the amplitude-modulated signal. A quadrature mixer (MIX2) mixes the quadrature oscillator signal (OSQ) with the amplitude-modulated signal so as to obtain a quadrature mixer output signal (MO2a). A phase-error corrector (PEC) adjusts the phase of the oscillator signals in response to a variation in the magnitude of an alternating current component (AC) in the quadrature mixer output signal (MO2a).

20 Claims, 5 Drawing Sheets

RECEIVER FOR AMPLITUDE-MODULATED SIGNALS

FIELD OF THE INVENTION

An aspect of the invention relates to a receiver for amplitude-modulated signals, such as, for example, television signals. The receiver may be, for example, a conventional television set, a settop box, a digital video recorder, a personal computer or any other multimedia apparatus. Other aspects of the invention relate to a method of controlling a receiver, a computer program product for a receiver, and an audiovisual system.

DESCRIPTION OF PRIOR ART

U.S. Pat. No. 4,631,499 describes a phase-locked loop that can be used to generate a synchronous RF carrier in a directly mixing AM receiver. The phase-locked loop comprises a phase detection arrangement that reduces an unwanted DC offset generated during phase detection. The phase detection arrangement comprises three cascade-coupled mixer stages. Two of these mixer stages receive an auxiliary mixing signal that has a relatively low frequency.

SUMMARY OF THE INVENTION

It is an object of the invention to provide an improved receiver. The invention is defined by the independent claims. The dependent claims define advantageous embodiments.

According to an aspect of the invention, a receiver has the following characteristics. A synchronization circuit provides a set of oscillator signals that are synchronized with a carrier of an amplitude-modulated signal. The set of oscillator signals comprises a quadrature oscillator signal, which is substantially 90° phase shifted with respect to the carrier of the amplitude-modulated signal. A quadrature mixer mixes the quadrature oscillator signal with the amplitude-modulated signal so as to obtain a quadrature mixer output signal. A phase correcting device corrects the phase of the oscillator signals in response to a variation in the magnitude of an alternating current component in the quadrature mixer output signal.

In a preferred embodiment, the phase correcting device comprises a phase-error corrector that applies a supplementary synchronization control signal to the synchronization circuit. The phase-error corrector adjusts the supplementary synchronization control signal in response to a variation in the magnitude of the alternating current component in the quadrature mixer output signal.

The invention takes the following aspects into consideration. Numerous receivers carry out a phase detection by means of a mixer circuit. The mixer circuit mixes a reception signal, which comprises a carrier, with a phase-detection oscillator signal that an oscillator arrangement provides. The mixer circuit provides a direct current signal that varies as a function of a static phase difference between the phase-detection oscillator signal and the carrier. The direct current signal is generally used to control the oscillator arrangement so that the static phase difference has a desired value for which reception quality is optimal.

In practice, a mixer circuit, which is used for phase detection, will provide a parasitic direct current signal in addition to a useful direct current signal that represents a static phase difference. The parasitic direct current signal is often referred to as a direct current offset or simply offset. The useful direct current signal is not distinguishable from the parasitic direct current signal. The parasitic direct current signal will introduce a phase control error in the sense that the static phase difference may be set to a value that is relatively far from a desired value for which reception quality is optimal. Consequently, the parasitic direct current signal, which the mixer circuit provides, adversely affects reception quality unless special measures are taken.

The aforementioned prior art (U.S. Pat. No. 4,631,499) proposes a special measure that prevents a parasitic direct current signal from causing a phase control error. This special measure involves an auxiliary mixing signal that modulates a phase-detection oscillator signal so as to obtain a modulated phase-detection oscillator signal. A mixer circuit mixes the modulated phase-detection oscillator signal with a carrier of a reception signal. The mixer circuit will provide an alternating current signal that is synchronous with the auxiliary mixing signal. This alternating current signal represents a static phase difference and is distinguishable from a parasitic direct current signal that the mixer circuit provides.

The special measure that the aforementioned prior art proposes has various drawbacks. The auxiliary mixing signal will cause a parasitic modulation of oscillator signals other than the phase-detection oscillator signal. These other oscillator signals generally serve to frequency convert a reception signal by mixing the reception signal with these other oscillator signals. The aforementioned parasitic modulation will be copied, as it were, to a frequency-shifted version of the reception signal. This will adversely affect reception quality. Another drawback is that the special measure, which the aforementioned prior art proposes, is relatively complex. A supplementary oscillator arrangement is required to generate the auxiliary mixing signal.

In accordance with the aforementioned aspect of the invention, the phase of the oscillator signals is adjusted in response to a variation in the magnitude of the alternating current component in the output signal of the quadrature mixer, which mixes the amplitude-modulated signal with the quadrature oscillator signal.

The quadrature mixer will demodulate the amplitude-modulated signal if there is a quadrature phase error: the quadrature oscillator signal is not precisely 90° phase shifted with respect to the carrier of the amplitude-modulated signal. The alternating current component in the output signal of the quadrature mixer is the amplitude-demodulated signal, which results from the quadrature phase error. The greater the magnitude of the alternating current component is, the larger the quadrature phase error is. Accordingly, a variation in the magnitude of the alternating current component indicates whether the quadrature phase error increases or decreases. An appropriate corrective action is taken in response to such a variation by means of adjusting the supplementary synchronization control signal, which is applied to the synchronization circuit. This forces the synchronization circuit, as it were, to reduce the quadrature phase error. Any parasitic direct current signal, which the quadrature mixer may provide, will not substantially affect the adjustment of the supplementary synchronization control signal because the adjustment is based on the alternating current component. What is more, the phase-error correction in accordance with the invention does not require any auxiliary mixing signal, which may cause parasitic modulation and which may therefore adversely affect reception quality as explained hereinbefore. For those reasons, the invention allows a relatively good reception quality.

Another advantage of the invention relates to the following aspects. As explained hereinbefore, a phase-error correction in accordance with the invention compensates for parasitic direct current signals, which may be present in the synchronization circuit. This makes the invention particularly suitable for use in direct conversion receivers, which generally suffer from parasitic direct current signals. Direct conversion receivers have various advantages. In a direct conversion receiver, a single oscillator can carry out a frequency conversion as well as a demodulation. In general, each oscillator in a receiver may produce parasitic signals, which may interfere with a desired signal. Since a direct conversion receiver requires relatively few oscillators, there is less risk of interference, which allows a better reception quality. Another advantage is that direct conversion receivers can generally be implemented as an integrated circuit with relatively few external components, which is cost efficient. Since the invention allows direct conversion receivers that are less sensitive to parasitic direct current signals, the invention allows low-cost receiver implementations that provide satisfactory reception quality.

These and other aspects of the invention will be described in greater detail hereinafter with reference to drawings.

DETAILED DESCRIPTION

Figure 1:
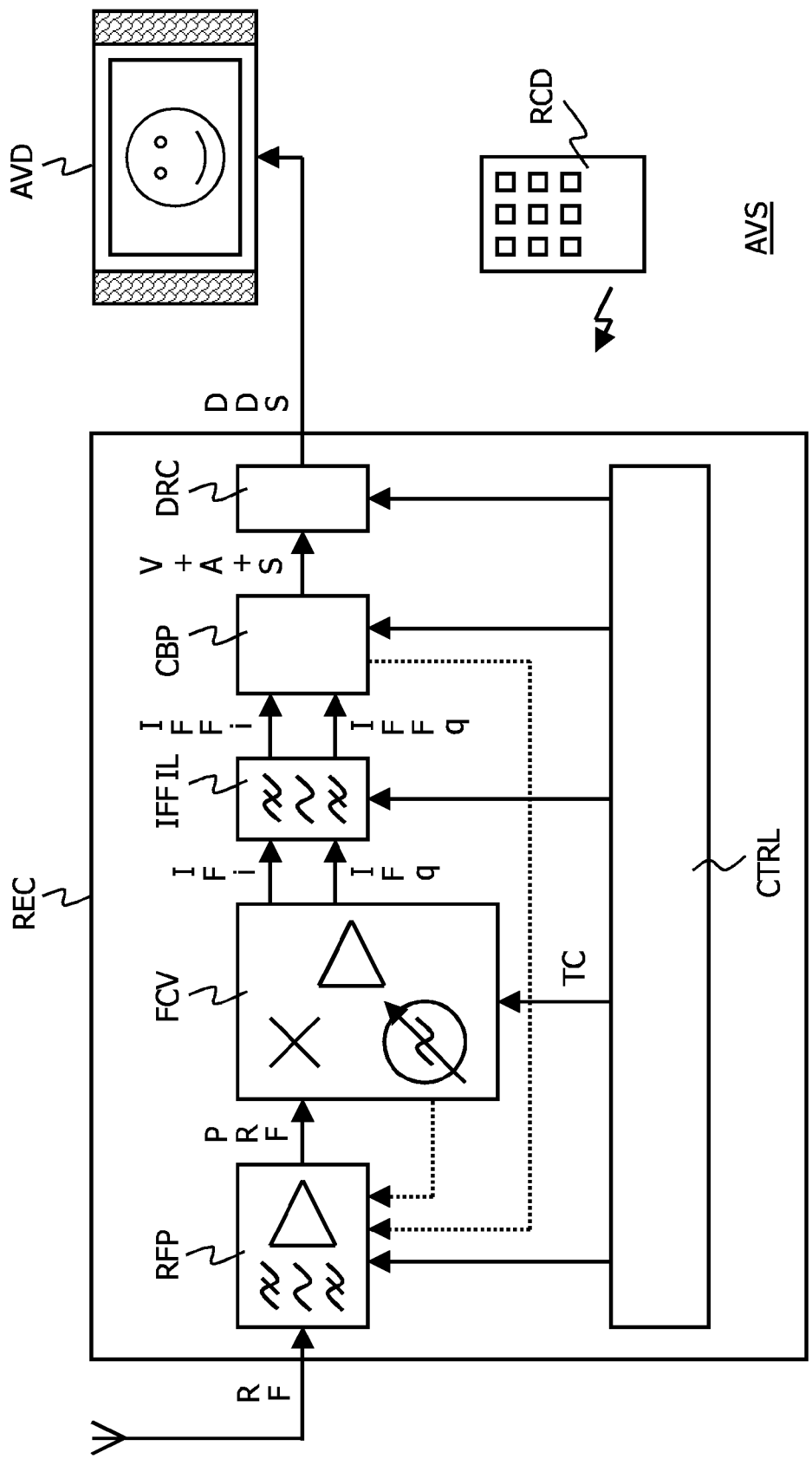
FIG. 1 is a block diagram that illustrates an audiovisual system.

FIG. 1 illustrates an audiovisual system AVS. The audiovisual system AVS comprises a receiver REC, an audiovisual rendering device AVD, and a remote control device RCD. The audiovisual rendering device AVD may be, for example, a flat panel display with stereo loudspeakers. The receiver REC causes the audiovisual rendering device AVD to render an audiovisual signal from a television (TV) station that a user has selected. The receiver REC comprises a radiofrequency processor RFP, a frequency converter FCV, an intermediate frequency filter IFFIL, a composite baseband processor CBP, a driver circuit DRC, and a controller CTRL. The intermediate frequency filter IFFIL may be a so-called polyphase filter, which allows a frequency response that is asymmetrical with respect to zero (0) frequency. The controller CTRL may be in the form of a suitably programmed microcontroller. The radiofrequency processor RFP and the frequency converter FCV may form part of a single integrated circuit, which may comprise other elements as well. The radiofrequency processor RFP, the frequency converter FCV, the intermediate frequency filter IFFIL, and the composite baseband processor CBP may form part of a single board, which can be plugged into a personal computer or any other multimedia device.

The receiver REC receives a radiofrequency spectrum RF that comprises a plurality of radiofrequency signals, which originate from different television stations. It will be assumed hereinafter that these radiofrequency signals are conventional analog television signals. A conventional analog television signal comprises a picture carrier that is amplitude modulated in an asymmetrical fashion. This type of amplitude modulation is often referred to as vestigial sideband modulation. An analog television signal further comprises a sound carrier, which is in fact an amplitude-modulation component of the picture carrier.

The receiver REC operates as follows. Let it be assumed that the user has selected a television station by means of the remote control device RCD. The remote control device RCD sends a command to the controller CTRL that indicates the television station to be selected. In response, the controller CTRL causes the radiofrequency processor RFP to provide a band pass characteristic that is centered on a radiofrequency signal that originates from the television station, which the user has selected. This radiofrequency signal will be referred to as selected television signal hereinafter. The radiofrequency processor RFP amplifies the selected television signal and attenuates other signals in the radiofrequency spectrum RF, in particular signals that are relatively distant in frequency from the selected television signal. The radiofrequency processor RFP applies a processed radiofrequency spectrum PRF to the frequency converter FCV.

The frequency converter FCV converts the processed radiofrequency spectrum PRF into an intermediate frequency spectrum IF, which has an in phase component IFi and a quadrature component IFq. Such a quadrature representation allows the intermediate frequency spectrum IF to be asymmetrical with respect to zero (0) frequency. The frequency converter FCV carries out a frequency shift. Accordingly, the intermediate frequency spectrum IF comprises a frequency-shifted version of the selected television signal.

The frequency shift, which the frequency converter FCV carries out, is such that the picture carrier of the frequency-shifted version of the selected television signal is at zero (0) frequency. Accordingly, the frequency converter FCV demodulates the selected television signal. The frequency-shifted-version of the selected television signal, which is comprised in the intermediate frequency spectrum IF, represents the amplitude modulation of the picture carrier. The amplitude modulation of the picture carrier is a composite baseband signal, which comprises a video baseband signal, a sound carrier, and synchronization signals.

The controller CTRL causes the frequency converter FCV to carry out this frequency shift by means of a tuning control signal TC, which the controller CTRL applies to the frequency converter FCV. A tracking circuit may provide synchronization between the frequency shift that the frequency converter FCV carries out and the band pass characteristic that the radiofrequency processor RFP provides. In such a case, the controller CTRL indirectly controls the radiofrequency processor RFP, namely via the tracking circuit.

The intermediate frequency filter IFFIL filters the intermediate frequency spectrum IF. The intermediate frequency filter IFFIL provides a band pass characteristic that comprises a Nyquist slope, which is centered on zero (0) frequency. The intermediate frequency filter IFFIL has a bandwidth that corresponds with a typical television signal bandwidth, which may be, for example 6 MHz. The intermediate frequency filter IFFIL provides a filtered intermediate frequency spectrum IFF, which has an in phase component IFFi and a quadrature component IFFq. The filtered intermediate frequency spectrum IFF substantially comprises the aforementioned composite baseband signal of the desired television signal. Any other signal is attenuated to relatively large extent.

The composite baseband processor CBP derives a video signal V, an audio signal A and synchronization signals S from the filtered intermediate frequency spectrum IFF. To that end, the composite baseband processor CBP may carry out various signal processing functions, such as, amplification, clamping, notch filtering, and sound demodulation, comparable to those in a conventional television receiver. In addition, the composite baseband processor CBP may provide a gain control signal for the radiofrequency processor RFP. FIG. 1 illustrates this by means of a broken line, which extends between the composite baseband processor CBP and the radiofrequency processor RFP. The gain control signal is representative of signal levels in the filtered intermediate frequency spectrum IFF.

The driver circuit DRC processes the video signal V, the audio signal A and the synchronization signals S so as to obtain a rendering driver signal DDS, which is suitable for the audiovisual rendering device AVD. To that end, the driver circuit DRC may carry out various signal processing operations, such as, for example, amplification, level shifting, analog-to-digital conversion, bias voltage generation, and synchronization pulse generation.

Figure 2:
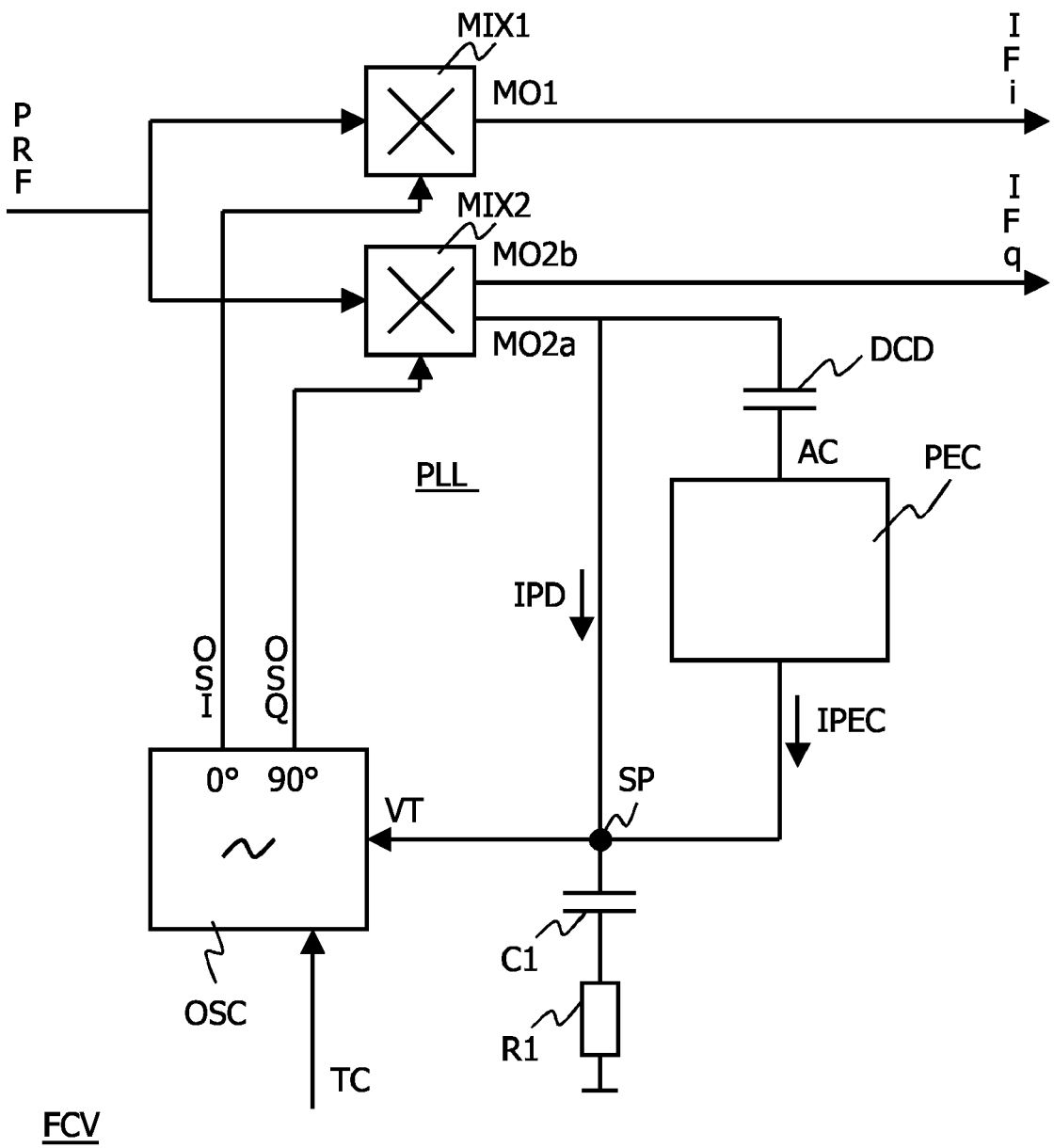
FIG. 2 is a block diagram that illustrates a frequency converter, which forms part of the audiovisual system.

FIG. 2 illustrates the frequency converter FCV. The frequency converter FCV comprises an oscillator arrangement OSC, two mixers MIX1, MIX2, a capacitor C1, a resistor R1, a direct current decoupler DCD, and a phase-error corrector PEC. The two mixers MIX1, MIX2, are preferably so-called double-balanced mixers, which have a symmetrical signal output. The direct current decoupler DCD may be in the form of, for example, direct-current-decoupling capacitors or a direct current control circuit that has a relatively large time constant.

The frequency converter FCV operates as follows. The oscillator arrangement OSC provides two oscillator signals: an in-phase oscillator signal OSI, and a quadrature oscillator signal OSQ. The two oscillator signals OSI, OSQ, have the same frequency, but have different phases. The quadrature oscillator signal OSQ leads 90° in phase with respect to the in-phase oscillator signal OSI. The two oscillator signals OSI, OSQ are substantially free of phase modulation. That is, the two oscillator signals OSI, OSQ are relatively pure carriers. The two oscillator signals OSI, OSQ may be obtained by means of, for example, a controllable oscillator, which has an oscillation frequency that is twice the frequency of the two oscillator signals OSI, OSQ and one or more divide-by-two circuits. A frequency division by two can translate, as it were, a 180° phase difference into a 90° phase difference, 90 being equal to 180 divided by 2.

The oscillator arrangement OSC carries out a frequency control in response to the tuning control signal TC from the controller CTRL, which FIG. 1 illustrates. The frequency control causes the frequency of the two oscillator signals OSI, OSQ to be in a relatively narrow frequency window centered on the picture carrier of the selected television signal. That is, the frequency control, which the tuning control signal TC defines, brings the frequency of the two oscillator signals OSI, OSQ close to that of the picture carrier. The frequency control may be obtained by means of, for example, a programmable frequency counter and various other logic circuits, such as a comparator circuit.

The oscillator arrangement OSC, mixer MIX2, the capacitor C1, and the resistor R1 constitute a conventional phaselock loop. This phaselock loop locks onto the picture carrier of the selected television signal. In a phaselock condition, the frequency of the two oscillator signals OSI, OSQ is equal to that of the picture carrier of the selected television signal. Mixer MIX2, which mixes the processed radiofrequency spectrum PRF with the quadrature oscillator signal OSQ, constitutes a phase detector. Mixer MIX2 provides two mixer output signals. Mixer output signal MO2a is a phase detection current IPD that varies as a function of a phase difference between the quadrature oscillator signal OSQ and the picture carrier of the selected television signal. The phase detection current IPD flows through a series connection of the capacitor C1 and the resistor R1, which constitutes a loop filter. This loop filter provides a tuning voltage VT, which the oscillator arrangement OSC receives. The frequency of the two oscillator signals OSI, OSQ varies as a function of the tuning voltage VT.

In the phaselock condition, there will be a static phase difference between the quadrature oscillator signal OSQ and the picture carrier of the selected television signal. Ideally, the static phase difference should exactly be 90°, which means that there is a perfect quadrature phase-relationship between the quadrature oscillator signal OSQ and the picture carrier of the selected television signal. There is no quadrature phase error. In that case, the phase detection current IPD will be free of any component that represents an amplitude modulation of the picture carrier of the selected television signal. Stated boldly, mixer MIX2 behaves as a pure phase detector if there is no quadrature phase error.

Let it be assumed that the aforementioned static phase difference is not exactly 90°. There is a quadrature phase error, which is generally the case in conventional phaselock loop circuits due to offset in these circuits. For example, the static phase difference may be 89° instead of 90°, which means that the quadrature phase error is 1°. In that case, mixer MIX2 behaves as a combination of a phase detector and an amplitude detector. The phase detection current IPD will comprise a component that represents the amplitude modulation of the picture carrier. This component will cause a parasitic phase modulation of the two oscillator signals OSI, OSQ.

Mixer MIX1 and mixer MIX2 mix the processed radiofrequency spectrum PRF with the in-phase oscillator signal OSI and the quadrature oscillator signal OSQ, respectively. Mixer MIX1 provides mixer output signal MO1, which constitutes the in phase component IFi of the intermediate frequency spectrum IF. Mixer MIX2 provides mixer output signal MO2b in addition to mixer output signal MO2a. Mixer output signal MO2a constitutes the phase detection current IPD mentioned hereinbefore. Mixer output signal MO2b constitutes the quadrature component IFq of the intermediate frequency spectrum IF.

It has been explained hereinbefore that the two oscillator signals OSI, OSQ may comprise a parasitic phase modulation if there is a quadrature phase error. Mixer MIX1 and mixer MIX2 mix the selected television signal with the in-phase oscillator signal OSI and the quadrature oscillator signal OSQ, respectively. As a result, the parasitic phase modulation will be copied, as it were, to the sound carrier of the frequency shifted version of the selected television signal. The sound carrier will thus have a parasitic phase modulation, which represents the amplitude modulation of the picture carrier. This parasitic modulation will cause interference in the audio signal A provided by the sound demodulator in the composite baseband processor CBP.

The phase-error corrector PEC provides a phase-error correction current IPEC, which is combined with the phase detection current IPD at a summing point SP. Consequently, the phase-error correction current IPEC affects the tuning voltage VT and therefore the phase and frequency of the quadrature oscillator signal OSQ. The phase-error correction current IPEC reduces a quadrature phase error, which may cause interference in the audio signal A that the composite baseband processor CBP provides. This phase-error correction is explained hereinafter.

The phase-error corrector PEC receives an alternating current component AC that is present in the phase detection current IPD and in the tuning voltage VT. The direct current decoupler DCD extracts the alternating current component AC from the phase detection current IPD and the tuning voltage VT. A quadrature phase error causes, at least partially, the alternating current component AC. As explained hereinbefore, mixer MIX2 will carry out an undesired amplitude demodulation if there is a quadrature phase error. The amplitude modulation of the picture carrier will, at least partially, cause the alternating current component AC in the phase detection current IPD and in the tuning voltage VT. The undesired amplitude demodulation, which mixer MIX2 carries out, has a gain factor that depends on the quadrature phase error. The larger the quadrature phase error is, the higher the gain factor of the undesired amplitude demodulation. Consequently, the larger the quadrature phase error is, the greater the magnitude of the alternating current component AC for a given amplitude modulation.

The phase-error corrector PEC detects whether the magnitude of the alternating current component AC is above a critical level or not. The phase-error correction current IPEC is substantially zero (0) if the magnitude is below the critical level. This means that the quadrature phase error is sufficiently small so that any interference in the audio signal A is at an acceptable level. Since the phase-error correction current IPEC is substantially zero (0) in that case, the phase-error corrector PEC neither charges nor discharges the capacitor C1 and therefore does not affect the tuning voltage VT. There is no corrective action.

Conversely, the phase-error corrector PEC charges or discharges capacitor C1 when the alternating current component AC is above the critical level. This will cause the tuning voltage VT to increase or decrease, respectively, which will change the quadrature phase error. The phase-error corrector PEC may derive information from the alternating current component AC so as to establish whether charging or discharging capacitor will decrease the quadrature phase error. The phase-error corrector PEC charges or discharges capacitor, depending on the information derived from the alternating current component AC, until the magnitude of alternating current component AC is below the critical level.

Alternatively, the phase-error corrector PEC may charge or decharge capacitor C1 and, subsequently, evaluate whether the magnitude of the alternating current component AC has decreased or increased. A decrease in magnitude tells the phase-error corrector PEC that the corrective action was in the right direction. The phase-error corrector PEC will continue to charge or discharge capacitor, whichever applies. Conversely, an increase in magnitude tells the phase-error corrector PEC that the corrective action should be in the opposite direction. The phase-error corrector PEC will subsequently charge capacitor C1 when capacitor C1 was previously discharged, or the phase-error corrector PEC will subsequently discharge capacitor C1 when capacitor C1 was previously charged, whichever is the case. In any case, the quadrature phase error will become sufficiently small so that the magnitude of the amplitude component is below the critical level.

Figure 3:
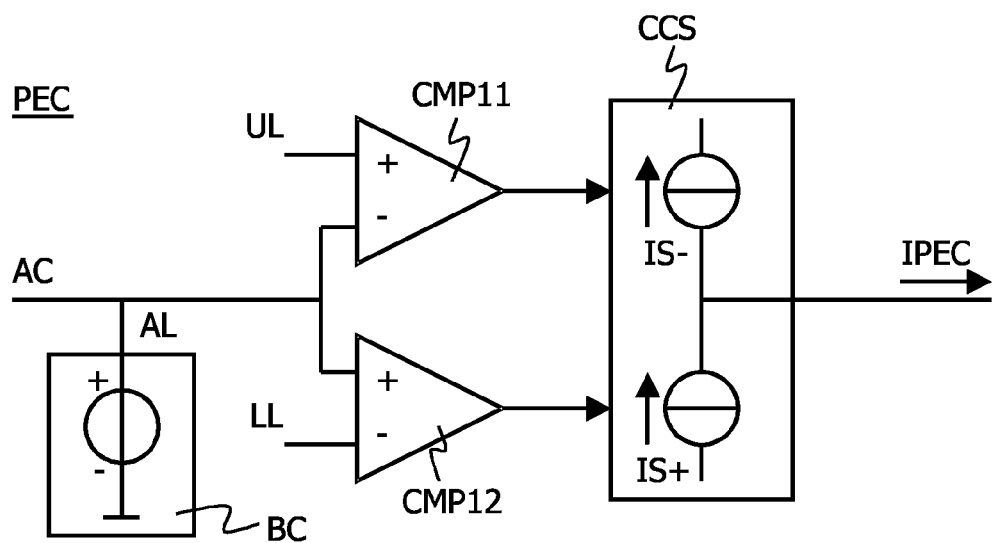
FIG. 3 is a block diagram that illustrates a sign-sensitive implementation of a phase-error corrector that forms part of the frequency converter.

FIG. 3 illustrates a sign-sensitive implementation of the phase-error corrector PEC, which decides on the basis of the alternating current component AC whether capacitor C1, which FIG. 2 illustrates, should be charged or discharged. The sign-sensitive implementation comprises a biasing circuit BC, two comparators CMP11, CMP12, and a controllable current source CCS.

The sign-sensitive implementation operates as follows. The biasing circuit BC defines an average level AL on which the alternating current component AC is superposed. The alternating current component AC may momentarily have a value that is below the average level AL or above the average level AL. Comparator CMP11 detects whether the value of the alternating current component AC is above an upper level UL. Comparator CMP11 causes the controllable current source CCS to provide a sink current IS− during a time interval in which the value of the alternating current component AC is above the upper level UL. Comparator CMP12 detects whether the value of the alternating current component AC is below a lower level LL. Comparator CMP12 causes the controllable current source CCS to provide a source current IS+ during a time interval in which the value of the alternating current component AC is below the lower level LL.

The controllable current source CCS thus provides the sink current IS− when the alternating current component AC exceeds the upper level UL and provides the source current IS+ when the alternating current component AC is below the lower level LL. The controllable current source CCS does substantially not provide any current when the alternating current component AC is between the lower level LL and the upper level UL. The average level AL is preferably centered between the lower level LL and the upper level UL.

Figure 4:
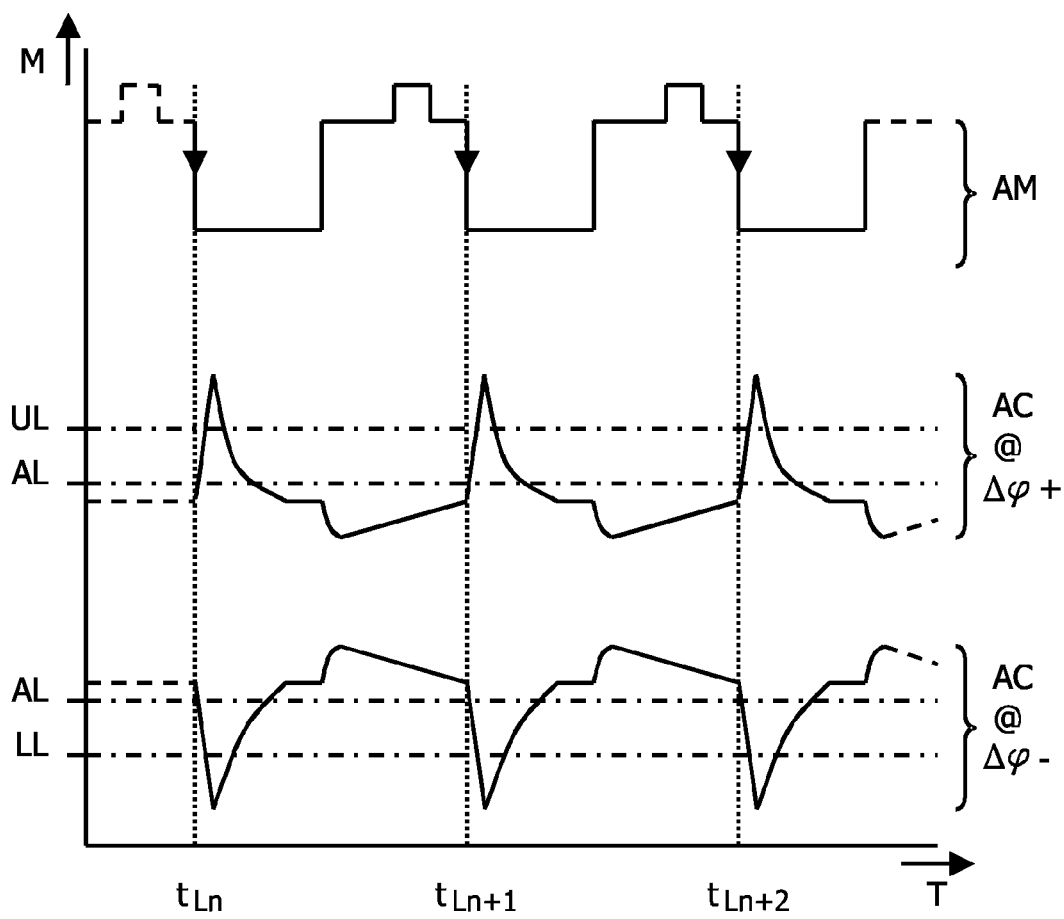
FIG. 4 is a signal diagram that illustrates comparison operations, which the sign-sensitive implementation carries out, for two phase errors of opposite sign.

FIG. 4 illustrates that the sign-sensitive implementation provides an appropriate corrective action. FIG. 4 combines three different graphs: an upper graph denoted AM, a middle graph denoted AC@Δϕ+, and a lower graph denoted AC@Δϕ−. The upper graph AM represents the amplitude modulation of the picture carrier, which is a negative type amplitude modulation. The middle graph AC@Δϕ+ represents the alternating current component AC at a given positive quadrature phase error. The lower graph AC@Δϕ− represents the alternating current component AC at a given negative quadrature phase error. The three graphs AM, AC@Δϕ+, AC@Δϕ− have a common horizontal axis, which represents time T. A vertical axis represents magnitude M in a superposed fashion.

The horizontal axis indicates three instants $t_{Ln}$, $t_{Ln+1}$, $t_{Ln+2}$, each of which represents the start of an active line interval. The amplitude modulation of the picture carrier comprises video information, which is to be displayed, during an active line interval. An active line interval is preceded by a so-called blanking interval. The start of an active line interval generally constitutes a black to white transition. The upper graph AM illustrates the occurrence of a black to white transition in form of a negative edge at each of the three aforementioned instants $t_{Ln}$, $t_{Ln+1}$, $t_{Ln+2}$. Since the amplitude modulation is of the negative type, a black to white transition corresponds with a sudden drop in magnitude of the picture carrier.

The middle graph AC@Δϕ+ and the lower graph AC@Δϕ− illustrate that the alternating current component AC will comprise pronounced spikes when there is a quadrature phase error. A black to white transition causes a spike in the alternating current component AC. The greater the quadrature phase error is, the greater the magnitude of the spikes in the alternating current component AC. Ideally, the alternating current component AC should be zero, and therefore not comprise any significant spikes. As explained hereinbefore, the alternating current component AC will be zero if there is no quadrature phase error.

The middle graph AC@Δφ+ and the lower graph AC@Δφ− further illustrate that the spikes have a positive sign or a negative sign depending on whether the quadrature phase error is positive or negative, respectively. As explained hereinbefore, mixer MIX2 will carry out an undesired amplitude demodulation if there is a quadrature phase error. The gain factor of the undesired amplitude demodulation has a sign that depends on the sign of the quadrature phase error. Stated otherwise, the undesired amplitude demodulation will be inverting or non-inverting depending on whether the quadrature phase error is positive or negative, respectively.

The middle graph AC@Δφ+ illustrates a case in which the positive quadrature phase error is relatively large. As a result, each spike has a peak that exceeds the upper level UL, which comparator CMP11 receives. Comparator CMP11 will cause the controllable current source CCS to provide the sink current IS− during each time interval in which the alternating current component AC exceeds the upper level UL. Consequently, the phase-error correction current IPEC will be in the form of sink current pulses. These sink current pulses will decharge the capacitor C1 illustrated in FIG. 2. This will cause a negative phase shift in the quadrature oscillator signal. Accordingly, the phase-error corrector PEC reduces the positive quadrature phase error.

The lower graph AC@Δφ− illustrates a case in which the negative quadrature phase error is relatively large. As a result, each spike has a peak that falls below the lower level LL which comparator CMP12 receives. Comparator CMP12 will cause the controllable current source CCS to provide the source current IS+ during each time interval in which the alternating current component AC falls below the lower level LL. Consequently, the phase-error correction current IPEC will be in the form of source current pulses. These source current pulses will charge the capacitor C1 illustrated in FIG. 2. This will cause a positive phase shift in the quadrature oscillator signal OSQ. Accordingly, the phase-error corrector PEC reduces the negative quadrature phase error.

It should be noted that FIG. 4 does not illustrate any quadrature phase error reduction for the purpose of simplicity. FIG. 4 applies when the phase-error correction current IPEC is measured but not applied to the summing point SP, which FIG. 2 illustrates. Stated otherwise, FIG. 4 illustrates an open loop measurement with respect to the phase-error correction.

Figure 5:
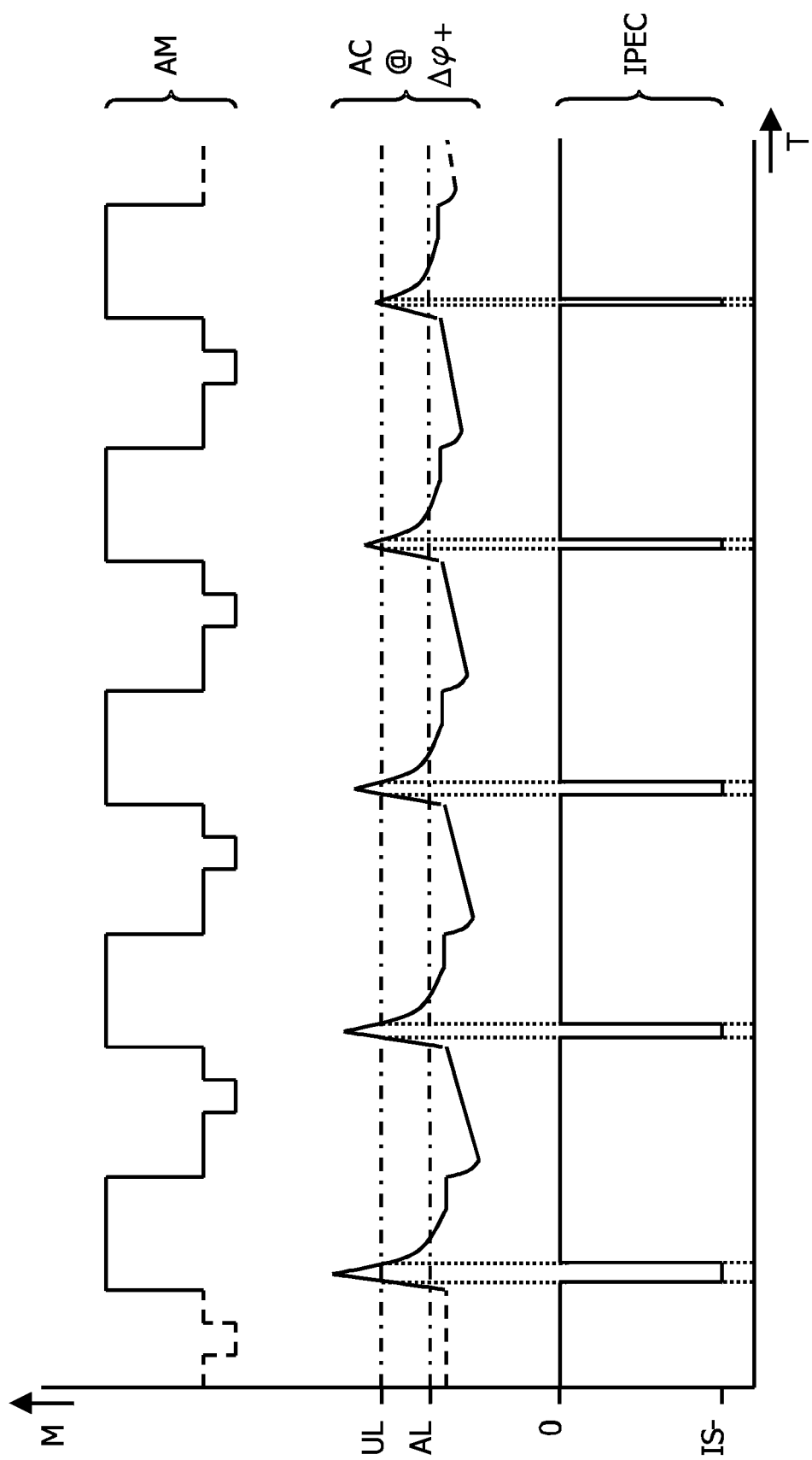
FIG. 5 is a time diagram that illustrates a phase-error reduction that the sign-sensitive implementation accomplishes.

FIG. 5 illustrates a positive quadrature phase error reduction that the phase-error corrector PEC carries out. A black and white transition causes a most left-hand spike in the alternating current component AC. The most left-hand spike has a relatively large magnitude, which means there is a relatively large quadrature phase error. The most left-hand spike will cause a relatively wide sink current pulse in the phase-error correction current IPEC. As explained hereinbefore, this sink current pulse will reduce the positive quadrature phase error. The positive quadrature phase error will therefore be smaller when a subsequent black and white transition occurs. As a result, a subsequent spike in the alternating current component AC will have a smaller magnitude. Consequently, the subsequent spike will cause a narrower sink current pulse in the phase-error correction current IPEC. This will further reduce the positive quadrature phase error to a somewhat lesser extent.

FIG. 5 thus illustrates that the phase-error corrector PEC carries out a time discrete corrective action, which gradually reduces the positive quadrature phase error. The smaller the positive quadrature phase error becomes, the narrower the current pulses in the phase-error correction current IPEC will be, and, therefore, the milder the corrective action becomes. In a manner of speaking, the phase-error corrector PEC provides a soft landing. In a steady state condition, the phase-error correction current IPEC will comprise relatively few current pulses, which will be relatively narrow. These current pulses, if any, serve to compensate for any current leakage or other parasitic direct current signal. The aforementioned equally applies to any negative quadrature phase error, which the phase-error corrector PEC will reduce a similar fashion.

Figure 6:
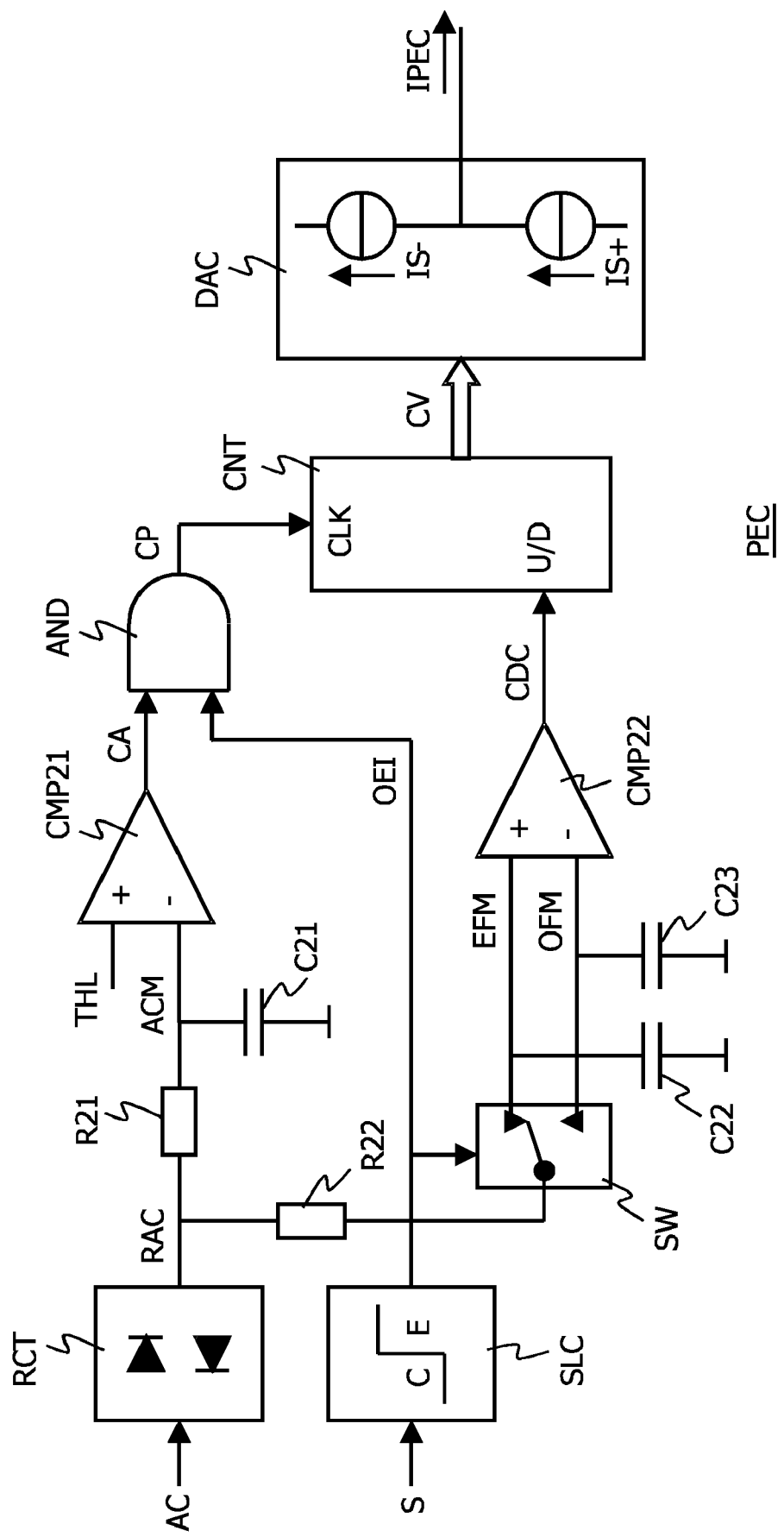
FIG. 6 is a block diagram that illustrates an automatic sign-determining implementation of the phase-error corrector that forms part of the frequency converter.

FIG. 6 illustrates an automatic sign-determining implementation of the phase-error corrector PEC, which automatically determines whether the capacitor C1 illustrated in FIG. 2 should be charged or decharged in order to reduce a quadrature phase error. The automatic sign-determining implementation comprises a rectifier RCT, a synchronization slicer SLC, a switch SW, two comparators CMP21, CMP22, an and-gate AND, a counter CNT, and a digital-to-analog converter DAC, two resistors R21, R22 and three capacitors C21, C22, C23.

The automatic sign-determining implementation operates as follows. The digital-to-analog converter DAC provides the phase-error correction current IPEC, which is a function of a counter value CV in the counter CNT. The phase-error correction current IPEC is zero (0) when the counter value CV is equal to a neutral value, which can be predefined. The phase-error correction current IPEC has a positive sign when the counter value CV exceeds the neutral value. In that case, the digital-to-analog converter DAC applies a source current IS+ to the summing point SP illustrated in FIG. 2. The larger the counter value CV is with respect to the neutral value, the larger the source current IS+ is. Conversely, the phase-error correction current IPEC has a negative sign when the counter value CV is below the neutral value. In that case, the digital-to-analog converter DAC applies a sink current IS− to the summing point SP illustrated in FIG. 2. The smaller the counter value CV is with respect to the neutral value, the larger the sink current IS− is. The phase-error correction current IPEC is thus a continuous sink current IS− or a continuous source current IS+, which the digital-to-analog converter DAC provides in response to the counter value CV in the counter CNT.

There is a range of suitable counter values for which the quadrature phase error will be relatively small. The phase-error correction current IPEC, which the digital-to-analog converter DAC provides, will substantially compensate an undesired direct current signal in the phaselock loop that FIG. 2 illustrates when the counter value CV is within the range of suitable counter values. The phase-error corrector PEC automatically adjusts the counter value CV in the counter CNT until the counter value CV is within the range of suitable counter values. The digital-to-analog converter DAC can be regarded as a controllable current source CCS, which is automatically controlled so that there is sufficient compensation for an undesired direct current signal in the phaselock loop that FIG. 2 illustrates. This automatic control mechanism is explained hereinafter.

The synchronization slicer SLC receives a field synchronization signal, which forms part of the synchronization signals S provided by the demodulator in the composite baseband processor CBP, as illustrated in FIG. 1. The synchronization slicer SLC provides an odd/even field indicating signal OEI. The odd/even field indicating signal OEI is a pulse signal having a value that corresponds with a binary 0 when there is an odd field, and has a value that corresponds with a binary 1 when there is an even field. A transition from an odd field to an even field causes a rising edge to occur in the odd/even field indicating signal OEI.

The rectifier RCT rectifies the alternating current component AC. Consequently, the rectifier RCT provides a rectified alternating current component RAC. Resistor R21 and capacitor C21 constitute a smoothing filter that smoothes the rectified alternating current component RAC so as to obtain an alternating-current magnitude indication ACM.

Comparator CMP21 compares the alternating-current magnitude indication ACM with a threshold level THL. Comparator CMP21 provides a count activation signal CA, which is a binary 1 if the alternating-current magnitude indication ACM is above the threshold level THL. Otherwise, the count activation signal CA is a binary 0. The and-gate AND receives the count activation signal CA and the odd/even field indicating signal OEI. The and-gate AND provides a clock pulse signal CP that is an and-function of the two aforementioned signals. The counter CNT receives this clock pulse signal CP at a clock input CLK.

Consequently, the counter CNT receives the odd/even field indicating signal OEI as a clock signal if the alternating-current magnitude indication ACM is above the threshold level THL. This means that the quadrature phase error, which causes the alternating current component AC, is above a critical level. In that case, a rising edge in the odd/even field indicating signal OEI, which corresponds to a transition from an odd field to an even field, causes the counter CNT to increment or decrement the counter value CV depending on whether the counter CNT is in an up-counting state or a down-counting state. Conversely, the and-gate AND prevents the odd/even field indicating signal OEI from reaching the counter CNT if the alternating-current magnitude indication ACM component is below the threshold level THL. This means that the alternating current component AC is below the critical level. The counter CNT maintains the counter value CV in that case.

The odd/even field indicating signal OEI switches the switch SW between two different states. FIG. 6 illustrates one of the two different states. The switch SW has this state during an even field, whereas the switch SW has the opposite state during an odd field. In the state that FIG. 6 illustrates, the rectified alternating current component RAC charges capacitor C22 via resistor R22. In the other state, the rectified alternating current component RAC charges capacitor C23 via resistor R22. Consequently, capacitor C22 provides an even-field magnitude indication EFM, which represents an average of the magnitude of the alternating current component AC during an even field. Capacitor C23 provides an odd-field magnitude indication OFM, which represents an average of the magnitude of the alternating current component AC during an odd field.

Comparator CMP22 compares the even-field magnitude indication EFM with the odd-field magnitude indication OFM. This comparison provides an indication whether a previous control action went in a right direction or in a wrong direction. Two directions are possible: the counter CNT increments the counter value CV by one unit or the counter CNT decrements the counter value CV by one unit, depending on whether the counter CNT is in the up-counting state is or in the down-counting state. One of these directions will decrease the quadrature phase error and will therefore decrease the magnitude of the alternating current component AC. This is the right direction. The other direction will increase the quadrature phase error and will therefore increase the magnitude of the alternating current component AC. This is the wrong direction.

It is recalled that the counter CNT may change the counter value CV by one unit when a rising edge occurs in the odd/even field indicating signal OEI which corresponds with a transition between an odd field and an even field occurs. That is, the most recent field when such a rising edge occurs is an odd field, which has just terminated. An even field has preceded this odd field.

Let it be assumed that the odd-field magnitude indication OFM, which capacitor C23 provides, is smaller than the even-field magnitude indication EFM, which capacitor C22 provides. This means that the magnitude of the alternating current component AC has decreased, and therefore that the quadrature phase error has decreased. The previous control action went in the right direction. Consequently, counter CNT should remain in the up-counting state or the down-counting state, whichever was applicable when the most recent previous rising edge occurred in the old even field indication signal.

Let it now be assumed that the odd-field magnitude indication OFM is greater than the even-field magnitude indication EFM. This means that the magnitude of the alternating current component AC has increased and therefore that the quadrature phase error has increased. The previous control action went in the wrong direction. Consequently, counter CNT should change state: counter CNT should be switched from the up-counting state to the down-counting state or from the down-counting state to the up-counting state, whichever is applicable.

Comparator CMP22 provides a control direction change signal CDC that corresponds to a binary 0 when the odd-field magnitude indication OFM is smaller than the even-field magnitude indication EFM. The previous control action went in the right direction. The control direction change signal CDC corresponds to a binary 1 when the even-field magnitude indication EFM is greater than the old field magnitude indication. The previous control action went in the wrong direction.

The counter CNT receives the control direction change signal CDC at an up/down-control input U/D. As mentioned hereinbefore, the counter CNT may be in the up-counting state or in the down-counting state. The counter CNT remains in the up-counting state or in the down-counting state, whichever is applicable, when the control direction change signal CDC corresponds to a binary 0. Conversely, the counter CNT will switch from the up-counting state to the down-counting state, or from the down-counting state to the up-counting state, whichever is applicable, when the control direction change signal CDC corresponds to a binary 1.

Initially, when the phase-error corrector PEC is switched on, the counter value CV may be equal to the neutral value. The counter CNT may be in the up-counting state or in the down-counting state. In any case, the phase-error corrector PEC will automatically detect whether the up-counting state or the down-counting state provides a control action that goes in the right direction or not. If not, the counter CNT changes states as explained hereinbefore.

Concluding Remarks

The detailed description hereinbefore with reference to the drawings illustrates the following characteristics, which are cited in various independent claims. In a receiver, a synchronization circuit (MIX2, OSC, C1, R1) provides a set of oscillator signals (OSI, OSQ) that are synchronized with a carrier of an amplitude-modulated signal. The set of oscillator signals (OSI, OSQ) comprises a quadrature oscillator signal (OSQ), which is substantially 90° phase shifted with respect to the carrier of the amplitude-modulated signal. A quadrature mixer (MIX2) mixes the quadrature oscillator signal (OSQ) with the amplitude-modulated signal so as to obtain a quadrature mixer output signal (MO2a). The phase of the oscillator signals is adjusted in response to a variation in the magnitude of an alternating current component (AC) in the quadrature mixer output signal (MO2a).

The detailed description hereinbefore further illustrates various optional characteristics, which are cited in the dependent claims. These characteristics may be applied to advantage in combination with the aforementioned characteristics. Various optional characteristics are highlighted in the following paragraphs. Each paragraph corresponds with a particular dependent claim.

The phase adjustment is effected by means of a supplementary synchronization control signal (IPEC), which is applied to the synchronization circuit (MIX2, OSC, C1, R1), and which is adjusted in response to a variation in the magnitude of an alternating current component (AC) in the quadrature mixer output signal (MO2a).

A comparator arrangement (CMP11, CMP12 in FIG. 3) gives the supplementary synchronization control signal (IPEC) a polarity that depends on whether the alternating current component (AC) momentarily exceeds an upper level (UL) or is momentarily below a lower level (LL). Such a phase-error correction can be achieved with relatively simple hardware and software, if any, and therefore allows cost-efficient implementations.

The comparator arrangement (CMP11, CMP12) causes a controllable current source (CSC), which provides output currents (IS+, IS−) of opposite polarity, to provide one output current (IS+) during a time interval when the alternating current component (AC) exceeds the upper level (UL) and other output current, which is of opposite polarity, during a time interval when the alternating current component (AC) is below the lower level (LL). This further contributes to cost-efficiency.

A clock generator (SLC in FIG. 6) provides a clock signal (OEI) that defines respective control instants when the supplementary synchronization control signal (IPEC) can be adjusted. A magnitude-variation detector (SW, C22, C23, CMP22) detects whether the magnitude of the alternating current component (AC) has decreased or increased since the most recent control instant. An adjustment controller (CNT) adjusts the supplementary synchronization control signal (IPEC) in the same direction as at the most recent control instant or in the opposite direction, depending on whether the alternating current component (AC) has decreased or increased, respectively. Such a phase-error correction is relatively reliable and robust because an appropriate corrective action can be established independent of any particular characteristics of the amplitude-modulated signal.

The adjustment controller (CNT) is prevented from adjusting the supplementary synchronization control signal (IPEC) when the magnitude of the alternating current component (AC) is below a threshold level (THL). This further contributes to a satisfactory reception quality because the supplementary synchronization control signal remains stable when a sufficiently small phase error has been achieved. This prevents any parasitic modulation of the set of oscillator signals, which may otherwise affect signal quality.

The magnitude-variation detector (SW, C22, C23, CMP22) establishes an average of the magnitude of the alternating current component (AC) during a time interval when the clock signal (OEI) has a high level and an average of the magnitude of the alternating current component (AC) during a subsequent time interval when the clock signal (OEI) has a low level. This allows cost-efficient implementations.

The receiver (REC) is a television receiver for receiving a television signal that alternately comprises fields of opposite sign, which are odd and even. The clock generator (SLC) causes the clock signal (OEI) to have a low level during a field of the one sign and a high level during a field of the opposite sign. This contributes to relatively good television reception quality for the following reasons. Black to white transitions, which occur a line frequency, will substantially determining the magnitude of the alternating current component. The magnitude of the alternating current component is averaged over a field period, which comprises several black to white transitions. Accordingly, this allows establishing with relatively great precision whether the magnitude of the alternating current component has decreased or increased. Consequently, this allows a relatively precise adjustment of the supplementary synchronization control signal that is applied to the synchronization circuit.

The quadrature mixer (MIX2) forms part of the synchronization circuit (MIX2, OSC, C1, R1). This further contributes to cost efficiency.

The aforementioned characteristics can be implemented in numerous different manners. In order to illustrate this, some alternatives are briefly indicated.

The aforementioned characteristics may be applied to advantage in any type of receiver. A receiver for conventional analog television signals is merely an example. The aforementioned characteristics may equally be applied in, for example, a receiver for digital communication signals. All what matters is that a reception signal comprises some form of amplitude modulation. It should further be noted that a phase-error correction in accordance with the invention could equally be applied in receivers other than direct conversion receivers, such as, for example, superheterodyne receivers. The phase-error correction may then be applied to a phase-lock loop demodulator rather than to a frequency converter. It should further be noted that a sign-sensitive phase-error correction, such as FIG. 3 illustrates, can be used for a positive type amplitude modulation (SECAM television signals) as well as a for a negative type amplitude modulation.

The quadrature mixer for the phase-error correction in accordance with the invention need not necessarily form part of the synchronization circuit, although this is advantageous from a cost point of view. For example, the frequency converter that FIG. 2 illustrates may be modified as follows. Mixer MIX2 is replaced by two different mixers, a phase detection mixer, which provides the phase detection current IPD, and a frequency conversion mixer, which provides the quadrature component rFq of the intermediate frequency spectrum IF. The direct current decoupler DCD may then be coupled to an output of the frequency conversion mixer so that the phase-error corrector PEC receives an alternating current component from this mixer instead of the phase detection mixer that forms part of the phaselock loop circuit.

The synchronization circuit may be implemented in numerous different fashions. FIG. 2 merely illustrates a relatively simple example, in which the capacitor C1 and the resistor R1 convert the phase detection current IPD into the tuning voltage VT. The synchronization circuit may comprise a more sophisticated signal path, which extends between a phase detector and an oscillator arrangement. Such a signal path may comprise, for example, amplifiers and active filter circuits, which may be controllable.

It is not necessary to combine the supplementary synchronization control signal, which the phase-error correction in accordance with the invention provides, with a basic supplementary synchronization control signal that the synchronization circuit provides so as to achieve synchronization between the set of oscillator signals and the amplitude-modulated signal. For example, the synchronization circuit may comprise an oscillator arrangement with various frequency control inputs. The oscillator arrangement may receive the basic supplementary synchronization control signal and the supplementary synchronization control signal that the phase-error correction in accordance with the invention provides, at different frequency control inputs.

There are numerous manners to carry out a phase-error correction in accordance with the invention. FIGS. 3 and 6 merely illustrate two hardware-based implementations. In another implementation, which involves software, an analog-to-digital converter may provide a digital version of an alternating current component that a quadrature mixer provides. A suitably programmed processor may adjust a supplementary synchronization control signal in response to a variation in the digital version of the alternating current component. A processor can be suitably programmed by means of a computer program product, which comprises a set of instructions that causes the processor to carry out an adjustment on the basis of a variation in the magnitude of the alternating current component.

There are numerous ways of implementing functions by means of items of hardware or software, or both. In this respect, the drawings are very diagrammatic, each representing only one possible embodiment of the invention. Thus, although a drawing shows different functions as different blocks, this by no means excludes that a single item of hardware or software carries out several functions. Nor does it exclude that an assembly of items of hardware or software or both carry out a function.

The remarks made herein before demonstrate that the detailed description with reference to the drawings, illustrate rather than limit the invention. There are numerous alternatives, which fall within the scope of the appended claims. Any reference sign in a claim should not be construed as limiting the claim. The word "comprising" does not exclude the presence of other elements or steps than those listed in a claim. The word "a" or "an" preceding an element or step does not exclude the presence of a plurality of such elements or steps.

The invention claimed is:

1. A receiver comprising:
    a synchronization circuit for providing a set of oscillator signals that are synchronized with a carrier of an amplitude-modulated signal, the set of oscillator signals comprising a quadrature signal, which is substantially 90° phase shifted with respect to the carrier of the amplitude-modulated signal;
    a quadrature mixer for mixing the quadrature signal with the amplitude-modulated signal so as to obtain an output signal; and
    a phase-error corrector for correcting the set of oscillator signals, by charging or discharging a capacitor to vary a tuning voltage, in response to a variation in magnitude of an alternating current component in the output signal.

2. The receiver as claimed in claim 1, wherein said phase-error corrector applies a supplementary synchronization control signal to the synchronization circuit phase and adjusts the supplementary synchronization control signal in response to the variation in the magnitude of the alternating current component in the output signal.

3. The receiver according to claim 2, the phase-error corrector further comprising:
    a comparator arrangement for giving the supplementary synchronization control signal a polarity that depends on whether the alternating current component momentarily exceeds an upper level or is momentarily below a lower level.

4. A receiver comprising:
    a synchronization circuit for providing a set of oscillator signals that are synchronized with a carrier of an amplitude-modulated signal, the set of oscillator signals comprising a quadrature signal, which is substantially 90° shifted with respect to the carrier of the amplitude-modulated signal;
    a quadrature mixer for mixing the quadrature signal with the amplitude-modulated signal so as to obtain an output signal; and
    a phase-error corrector for correcting the set of oscillator signals in response to a variation in magnitude of an alternating current component in the output signal, wherein the phase-error corrector comprises a controllable current source for providing output currents of opposite polarity and a comparator arrangement arranged to cause the controllable current source to provide a first output current during a time interval when the alternating current component exceeds an upper level and a second output current, which is of opposite polarity, during a time interval when the alternating current component is below a lower level.

5. The receiver according to claim 2, the phase-error corrector further comprising:
    a clock generator for providing a clock signal that defines respective control instants when the supplementary synchronization control signal can be adjusted;
    a magnitude-variation detector for detecting whether the magnitude of the alternating current component has decreased or increased since a most recent control instant; and
    an adjustment controller for adjusting the supplementary synchronization control signal in a direction a depending on whether the alternating current component has decreased or increased at the most recent control instant.

6. The receiver according to claim 5, the phase-error corrector further comprising:
    a control activation circuit for preventing the adjustment controller from adjusting the supplementary synchronization control signal when the magnitude of the alternating current component is below a threshold level.

7. The receiver according to claim 5, the magnitude-variation detector further comprising:
    an averaging unit that establishes an average of the magnitude of the alternating current component during a time interval when the clock signal has a high level, and during a subsequent time interval when the clock signal has a low level.

8. The receiver according to claim 5, further comprising:
    a television receiver for receiving a television signal that alternately comprises fields of opposite sign, the clock generator being arranged to cause the clock signal to have a low level during a field of one sign and a high level during a field of the opposite sign.

9. The receiver according to claim 1, the quadrature mixer forming part of the synchronization circuit.

10. A method of correcting a phase error in a receiver, the method comprising:
    providing a set of oscillator signals that are synchronized with a carrier of an amplitude-modulated signal, the set of oscillator signals comprising a quadrature signal, which is substantially 90° phase shifted with respect to the carrier of the amplitude-modulated signal;
    mixing the quadrature signal with the amplitude-modulated signal so as to obtain an output signal; and
    phase correcting said set of oscillator signals, by charging or discharging a capacitor to vary a tuning voltage, in response to a variation in magnitude of an alternating current component in the output signal.

11. An audiovisual system comprising: a receiver according to claim 1; and
an audiovisual rendering device for rendering a signal that the receiver has derived from a reception signal.

12. The receiver of claim 1, further comprising:
a digital to analog converter that provides a phase error correction current.

13. The receiver of claim 12, further comprising:
a counter, coupled to the digital to analog converter, wherein the phase error correction current is a function of a counter value in the counter.

14. The receiver of claim 1, further comprising:
a synchronization slicer that receives a field synchronization signal and provides an odd/even field indicating signal.

15. The receiver of claim 1, further comprising:
a rectifier that receives the alternating current component and provides a rectified alternating current component.

16. The receiver of claim 15, further comprising:
a smoothing filter, coupled to the rectifier, that converts the rectified alternating current component into an alternating current magnitude indication.

17. The receiver of claim 1, further comprising:
an even field capacitor that provides an even field magnitude indication; and
an odd field capacitor that provides an odd field magnitude indication.

18. The receiver of claim 17, further comprising:
a comparator that compares the even field magnitude indication with the odd field magnitude indication.

19. The receiver of claim 1, further comprising:
a biasing circuit that defines an average level on which the alternating current component is superposed.

20. The receiver of claim 1, the quadrature mixer further comprising:
a phase detection mixer; and
a frequency conversion mixer.

* * * * *